United States Patent [19]

Ooizumi et al.

[11] Patent Number: 5,602,058
[45] Date of Patent: Feb. 11, 1997

[54] METHOD AND APPARATUS FOR APPLYING A WAFER TO A MOUNT PLATE

[75] Inventors: Kimiwaka Ooizumi, Sayama; Kouichi Tanaka, Higashiyamato, both of Japan

[73] Assignee: Enya Systems Limited, Japan

[21] Appl. No.: 359,880

[22] Filed: Dec. 20, 1994

[30] Foreign Application Priority Data

Dec. 21, 1993 [JP] Japan ................................. 5-344669

[51] Int. Cl.⁶ ................................................ H01L 4/60
[52] U.S. Cl. .......................... 437/209; 437/211; 437/214; 437/217
[58] Field of Search .................................. 437/209, 210, 437/211, 214, 215, 217, 219, 220; 269/21, 903

[56] References Cited

U.S. PATENT DOCUMENTS

| | | | |
|---|---|---|---|
| 5,037,262 | 8/1991 | Moll et al. | 269/903 |
| 5,105,255 | 4/1992 | Shannon et al. | 437/209 |
| 5,273,615 | 12/1993 | Asetta et al. | 269/21 |
| 5,303,938 | 4/1994 | Miller et al. | 269/21 |
| 5,324,381 | 6/1994 | Nishiguchi | 437/209 |
| 5,410,791 | 5/1995 | Wirth et al. | 269/21 |

*Primary Examiner*—Kevin Picardat
*Attorney, Agent, or Firm*—Adams & Wilks

[57] ABSTRACT

A method and apparatus are provided for applying a wafer to a mount plate. A wafer having a lower surface coated with an adhesive layer is held by a vacuum chuck through suction. A vacuum-tight sealing enclosure is placed over the wafer and a mount plate to define a sealed space. The sealed space is then evacuated at a degree of vacuum higher than the degree of vacuum of the vacuum chuck to effect release of the wafer from the vacuum chuck and dropping of the wafer onto the mount plate. The wafer is applied to the mount plate without the occlusion of air bubbles between the wafer and the mount plate.

31 Claims, 1 Drawing Sheet

METHOD AND APPARATUS FOR APPLYING A WAFER TO A MOUNT PLATE

BACKGROUND OF THE INVENTION

(1) Field of the Invention

The present invention relates to a method and apparatus for applying a wafer, such as a semiconductor wafer, to a mount plate to be arranged into a polishing machine for polishing the surface of the wafer smooth. Particularly, the present invention relates to a method for applying a wafer to a mount plate so that no air bubbles are occluded between the wafer and the mount plate.

(2) Background Information

Since semiconductor devices have become ultrahighly integrated, wafers used for such semiconductor devices are required to have an extremely high degree of flatness. To obtain such a flatness with high precision, the wafer is adhered by adhesive to a mount plate of a polishing machine in preparation to be polished by the polishing machine. However, when the wafer is adhered to the mount plate, if air bubbles are occluded in the adhesive between the wafer and the mount plate, the wafer is bulged at the portions of the mount plate containing the air bubbles. Thus, when polished, the abrasion amount at the portions of the mount plate which bulge as a result of the air bubbles will be larger than the other portions of the mount plate, and uniform and adequate polishing of the entire surface of the wafer becomes impossible. Accordingly, various methods have been conducted to prevent the occlusion of air bubbles between the wafer and the mount plate.

To carry out the removal of such air bubbles, a method is known wherein a wafer is applied on a mount plate with an adhesive and then the air bubbles which are occluded between the wafer and the mount plate are pressed out. In this method, before the hardening of the adhesive, the wafer is gradually pressed against the mount plate with an elastic member from the central portion of the wafer toward the peripheral portion thereof (Japanese Unexamined Utility Model Publication No. 4-88033). In another method, the area around the wafer is placed in a vacuum condition and then the wafer is pressed against the mount plate. In this method, the area around the wafer is surrounded with a skirt portion and the inside of the skirt portion is placed in a vacuum condition, and then the wafer is pressed against the mount plate in the vacuum atmosphere without the occlusion of air bubbles (Japanese Unexamined Patent Publication No. 64-45567).

The aforementioned conventional methods for applying a wafer to a mount plate include the step of pressing the wafer against the mount plate with an elastic member or the like to remove the air bubbles. Such a step also requires controlling the adjustment of the pressing force and/or the adjustment of the time of application of the pressing force, which are complicated and time consuming. Furthermore, since the wafer is thin, when the wafer is pressed the press mark on the surface of the wafer may sometimes remain as a small concavity, thereby imparting a wavy surface to the wafer.

Particularly, in the method wherein the wafer is held by suction force with a vacuum chuck and is pressed against the mount plate in the vacuum atmosphere by pressing down the vacuum chuck through a piston, the wafer is pressed strongly against the mounting plate and a press mark by the chuck is likely to remain on the surface of the wafer. When polished, the press mark will form a concave portion and prevent uniform and smooth polishing of the entire surface of the wafer. Furthermore, in this conventional method, the wafer is pressed by atmospheric pressure acting on the piston of the vacuum chuck, namely, the pressing is controlled by the relative pressure between the vacuum pressure of the vacuum chuck and the atmospheric pressure. Hence, since the holding force or the pressing force depends on whether there is a low or high atmospheric pressure weather condition, the wafer may drop or the pressing force may become insufficient during operation, leading to adjustment difficulties.

SUMMARY OF THE INVENTION

An object of the present invention is to provide a method and apparatus for applying a wafer to a mount plate without positively pressing the wafer against the mount plate and without the occlusion of air bubbles between the wafer and the mount plate.

Another object of the present invention is to provide a method and apparatus for applying a wafer to a mount plate wherein the wafer can be applied to the mount plate without employing conventional complicated processes by which press marks remain on the wafer and air bubbles are occluded between the wafer and the mount plate.

In one aspect of the present invention, an apparatus for applying a wafer to a mount plate comprises a main body having a suction hole opened at an end face thereof and a vacuum holder having at least one hole communicated with the suction hole for holding a wafer through suction at one end surface. A vacuum-tight enclosure is supported by the main body for enclosing the vacuum holder and defining a sealed space between the enclosure, the vacuum holder and the surface of a mount plate to which a wafer is applied. A vacuum source is connected in fluid communication with the sealed space for evacuating the sealed space to effect dropping of a wafer held by the vacuum holder to apply the wafer to the surface of a mount plate.

In another aspect of the present invention, a method for applying a wafer to a mount plate comprises: providing a wafer having upper and lower surfaces; applying the wafer at the upper surface thereof to a vacuum holder to hold the wafer through suction; coating one of a surface of a mount plate and the lower surface of the wafer with an adhesive layer; placing a vacuum-tight sealing enclosure over the wafer and the surface of the mount plate to define a sealed space while maintaining the lower surface of the wafer at a predetermined distance from the surface of the mount plate; and evacuating the sealed space at a degree of vacuum higher than the degree of vacuum of the vacuum holder to effect dropping of the wafer from the vacuum holder to apply the wafer to the surface of the mount plate.

Other objects, features and advantages of the present invention will become readily apparent to those skilled in the art upon a reading of the following description thereof with references to the accompanying drawings.

BRIEF DESCRIPTION OF THE DRAWINGS

While this invention is susceptible of embodiments in many different forms, the specification and the accompanying drawings disclose only some specific forms as examples of the use of the invention. The invention is not intended to be limited to the embodiments so described, and the scope of the invention will be pointed out in the appended claims. In the drawings:

DETAILED DESCRIPTION OF THE PREFERRED EMBODIMENTS

Figure 1:
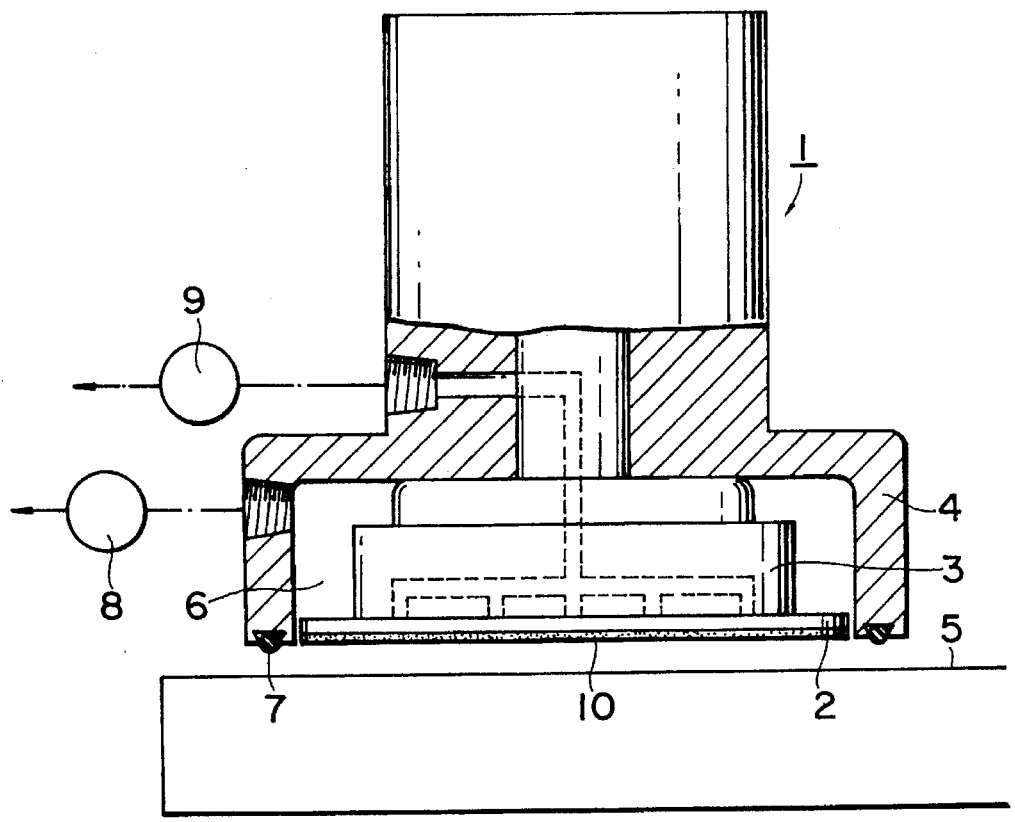
FIG. 1 is a cross-sectional view of one embodiment of an apparatus for applying a wafer to a mount plate according to the present invention.
Figure 2:
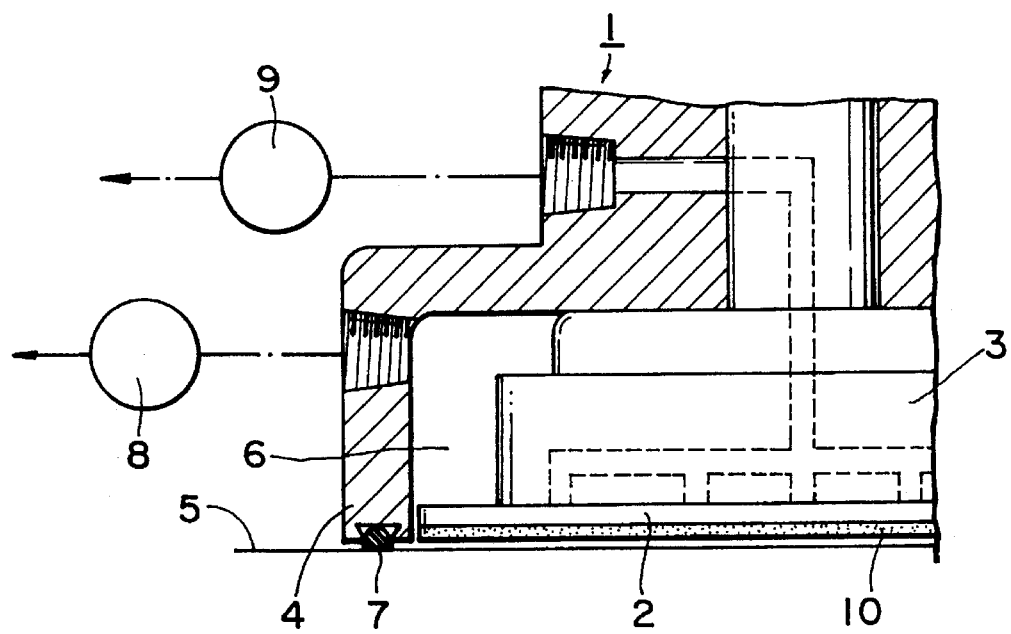
FIG. 2 is an enlarged cross-sectional view of the apparatus shown in FIG. 1 under the condition that the enclosure abuts the mount plate, with parts broken away.

Referring now to the drawings in detail, FIGS. 1–2 show one preferred example of an apparatus for applying a wafer to a mount plate 5 according to the present invention. A main body 1 is provided with a suction hole 1a opened at an end face 1b. Wafer holding means 3, such as a vacuum holder or chuck, includes holes 3a communicated with the suction hole 1a for holding the upper surface 2a of a wafer 2 through suction. The main body 1 is also provided with a depending enclosure or hood 4 surrounding the wafer 2. At the lower edge of the hood 4, an elastic seal member 7 is provided and extends circumferentially therearound so that when the lower edge of the hood 4 abuts the mount plate 5, the interior space section 6 in the hood 4 is sealed. The space section 6 of the hood 4 is preferably made as small as possible so that the space section 6, when sealed, can be placed rapidly in a vacuum condition. The inner diameter of the space section 6 of the hood 4 is preferably formed only slightly larger than the outer diameter of the wafer 2 so as to effectively guide the downward movement of the wafer after it is released by the vacuum chuck 3.

The lower surface 2b of the wafer 2 is coated with an adhesive layer 10 for use in releasably bonding the wafer to the mount plate 5, such as for polishing with a polishing machine (not shown). However, it is understood by those skilled in the art that the adhesive layer 10 may be coated on the surface 5a of the mount plate 5 to which the wafer 2 is applied instead of on the lower surface 2b of the wafer.

In this embodiment, the vacuum chuck 3 is fixed to the main body 1 at an upper wall of the hood 4. The wafer 2 is transferred to the vacuum chuck by an appropriate means, such as a robot (not shown), and held by suction. The main body 1, along with the hood 4, may be displaced so that it will not obstruct the transfer of the wafer 2 to the vacuum chuck 3 in a manner by which the vacuum chuck is exposed out of the hood 4 to hold the wafer 2. However, it is understood by those skilled in the art that other methods and structural arrangements are suitable for transferring the wafer 2 to the vacuum chuck 3. For example, the vacuum chuck 3 may be arranged in an axially movable fashion by an appropriate mechanism, such as a cylinder mechanism or a cam mechanism (not shown) supported by the main body 1, so that the vacuum chuck receives the wafer 2 at an extended position thereof, where it protrudes out of the hood 4, and holds the wafer 2 within the hood 4 at a retracted position thereof.

Both the space section 6 of the hood 4 which surrounds the wafer 2 and the vacuum chuck 3 communicate with a vacuum source (not shown) by way of valves 8, 9, respectively. The degree of vacuum applied to the vacuum chuck 3 is preferably adjusted to be from about 600 mmHg to about 650 mmHg so that it will hold by suction various wafers having different outer diameters. The degree of vacuum applied to the space section 6 is higher than the vacuum applied to the vacuum chuck 3 by from about 90 mmHg to about 160 mmHg, preferably about 100 mmHg, and is adjusted to be preferably from about 740 mmHg to about 760 mmHg so that it will sufficiently evacuate the space section 6. It is understood that the difference in vacuum pressures between the vacuum applied to the vacuum chuck 3 and the vacuum applied to the sealed space section 6 may be made smaller than 90 mmHg depending on the weight of the wafer 2 which is to be applied to the mount plate 5.

In operation of the apparatus, the wafer 2 is transferred to and held by suction by the vacuum chuck 3 while the main body 1, along with the hood 4, is displaced so as not to obstruct the transfer of the wafer 2 to the vacuum chuck. The adhesive layer 10 is coated on the lower surface 2b of the wafer 2 or on the surface 5a of the mount plate 5 before or after transferring the wafer 2 to the vacuum chuck 3. The main body 1 is then positioned relative to the vacuum chuck 3 as shown in FIG. 1, wherein the hood 4 surrounds the wafer 2. The main body 1 is then lowered toward the mount plate 5 so that the seal member 7 at the lower edge of the hood 4 abuts snugly on the mount plate 5 to seal the interior space 6 and position the wafer 2 close to the mount plate 5 as shown in FIG. 2. Alternatively, the lower end of the hood 4 may be brought into abutment with the mount plate 5 by holding the main body 1 stationary and moving the mount plate 5 towards the main body 1. The distance between the lower surface of the wafer 2 to which the adhesive layer 10 is applied and the surface 5a of the mount plate 5 is desirably as small as possible, for example, from about 0.2 mm to about 3 mm, preferably about 0.5 mm.

Under the condition that the space section 6 surrounding the wafer 2 is sealed as shown in FIG. 2, when the valve 8 is opened and the air within the space section 6 is evacuated at the above-mentioned degree of vacuum, the air between the lower surface 2b of the wafer 2 and the surface 5a of the mount plate 5 will be removed. Then, when the degree of vacuum in the space section 6 exceeds the degree of vacuum of the vacuum chuck 3, the wafer 2 drops from the vacuum chuck 3 onto the mount plate 5 and is adhered to the mount plate 5 by the adhesive layer 10. The vacuum lines for evacuating the space section 6 and the vacuum chuck 3 may be provided with pressure gauges (not shown). The release of the wafer 2 from the vacuum chuck 3 can be confirmed when the indicated values of these pressure gauges become identical to each other. Thereafter, air is introduced into the space section 6 and the main body 1 may be detached from the mount plate 5.

According to the present invention, no air bubbles are occluded into the adhesive layer 10 between the wafer 2 and the surface 5a of the mount plate 5 as a result of evacuating the air in the space section 6 surrounding the wafer. Furthermore, since the degree of vacuum in the space section 6 is made higher than the degree of vacuum of the vacuum chuck 3 which holds the wafer 2 by suction, the wafer will drop from the vacuum chuck 3 to the mount plate 5 due to the difference in the degrees of vacuum without the vacuum chuck having to be pressed against the mount plate. Thus, the wafer 2 can be applied to the mount plate 5 by means of the adhesive layer 10 which is coated on the lower surface of the wafer in an efficient and economical manner.

According to the present invention, the holding and application of the wafer 2 is controlled by absolute pressure by using only vacuum pressure, and the application is conducted without being influenced by environmental conditions. Accordingly, no press marks by the vacuum chuck 3 will remain on the surface of the wafer 2, unlike with the conventional methods, and a wafer having a high precision flatness can be obtained.

From the foregoing description, it can be seen that the present invention comprises an improved method and apparatus for applying a wafer to a mount plate. It will be appreciated by those skilled in the art that changes can be made to the embodiments described in the foregoing description without departing from the broad inventive concept thereof. It is understood, therefore, that this invention is not limited to the particular embodiments disclosed, but is intended to cover all modifications which are within the scope and spirit of the invention as defined by the appended claims.

We claim:

1. A method for applying a wafer to a mount plate, comprising the steps of:

providing a wafer having a lower surface coated with an adhesive layer;

applying the wafer at an upper surface thereof to a vacuum holder to hold the wafer through suction;

placing a vacuum-tight sealing enclosure over the wafer and the surface of the mount plate to define a sealed space while maintaining the lower surface of the wafer at a predetermined distance from the surface of the mount plate; and evacuating the sealed space at a degree of vacuum higher than the degree of vacuum of the vacuum holder to effect release of the wafer from the vacuum holder and dropping of the wafer onto the surface of the mount plate.

2. A method for applying a wafer to a mount plate as claimed in claim 1; wherein the applying step comprises adjusting the degree of vacuum of the vacuum holder from 600 mmHg to 650 mmHg.

3. A method for applying a wafer to a mount plate as claimed in claim 1; wherein the evacuating step comprises evacuating the sealed space at a degree of vacuum of from 90 mmHg to 160 mmHg higher than the degree of vacuum of the vacuum holder.

4. A method for applying a wafer to a mount plate as claimed in claim 1; wherein the placing step includes maintaining the lower surface of the wafer 0.2 mm to 3 mm above the surface of the mount plate.

5. A method for applying a wafer to a mount plate as claimed in claim 1; wherein the applying step comprises applying a semiconductor wafer to the vacuum holder.

6. A method for applying a wafer to a mount plate, comprising the steps of:

providing a wafer having a lower surface coated with an adhesive layer and an upper surface;

providing a main body having an enclosure and a suction hole;

providing a vacuum holder having at least one hole communicated with the suction hole;

applying the wafer at the upper surface thereof to the vacuum holder to hold the wafer through suction;

placing the enclosure over the vacuum holder and the wafer;

positioning the main body over the surface of the mount plate to define a vacuum-tight sealed space while maintaining the lower surface of the wafer at a predetermined distance from the surface of the mount plate; and evacuating the sealed space at a degree of vacuum higher than the degree of vacuum of the vacuum holder to effect release of the wafer from the vacuum holder and dropping of the wafer onto the surface of the mount plate.

7. A method for applying a wafer to a mount plate as claimed in claim 6; wherein the evacuating step comprises evacuating the sealed space at a degree of vacuum of from 90 mmHg to 160 mmHg higher than the degree of vacuum of the vacuum holder.

8. A method for applying a wafer to a mount plate as claimed in claim 6; wherein the placing step includes maintaining the lower surface of the wafer 0.2 mm to 3 mm above the surface of the mount plate.

9. A method for applying a wafer to a mount plate as claimed in claim 6; wherein the applying step comprises adjusting the degree of vacuum of the vacuum holder from 600 mmHg to 650 mmHg.

10. A method for applying a wafer to a mount plate as claimed in claim 6; wherein the applying step comprises applying a semiconductor wafer to the vacuum holder.

11. A method for applying a wafer to a mount plate, comprising the steps of:

providing a wafer having a first surface and a second surface;

providing a mount plate having a main surface;

providing a main body having an enclosure;

disposing an adhesive on the first surface of the wafer or on the main surface of the mount plate;

applying the wafer at the second surface thereof to a vacuum holder to hold the wafer through suction;

placing the enclosure over the vacuum holder and the wafer;

positioning the main body and the mount plate relative to one another to define a vacuum-tight sealed space within the enclosure while maintaining the first surface of the wafer at a given distance from the main surface of the mount plate; and evacuating the sealed space to effect release of the wafer from the vacuum holder and displacement of the wafer to bring the first surface thereof into contact with the main surface of the mount plate to thereby mount the wafer thereon by the adhesive.

12. A method for applying a wafer to a mount plate as claimed in claim 11; wherein the evacuating step comprises evacuating the sealed space at a degree of vacuum higher than the degree of vacuum of the vacuum holder.

13. A method for applying a wafer to a mount plate as claimed in claim 12; wherein the evacuating step comprises evacuating the sealed space at a degree of vacuum of from 90 mmHg to 160 mmHg higher than the degree of vacuum of the vacuum holder.

14. A method for applying a wafer to a mount plate as claimed in claim 11; wherein the placing step includes maintaining the first surface of the wafer at a distance of 0.2 mm to 3 mm from the main surface of the mount plate.

15. A method for applying a wafer to a mount plate as claimed in claim 11; wherein the applying step comprises adjusting the degree of vacuum of the vacuum holder from 600 mmHg to 650 mmHg.

16. A method for applying a wafer to a mount plate as claimed in claim 11; wherein the disposing step comprises disposing the adhesive layer on the first surface of the wafer.

17. A method for applying a wafer to a mount plate as claimed in claim 11; wherein the disposing step comprises disposing the adhesive layer on the main surface of the mount plate.

18. A method for applying a wafer to a mount plate as claimed in claim 11; wherein the positioning step comprises positioning the main body over the main surface of the mount plate while maintaining the mount plate in a fixed state.

19. A method for applying a wafer to a mount plate as claimed in claim 11; wherein the positioning step comprises positioning the main surface of the mount plate opposite to the first surface of the wafer while maintaining the main body and the vacuum holder in a fixed state.

20. A method for applying a wafer to a mount plate as claimed in claim 11; wherein the placing step comprises placing the enclosure over the wafer to surround a circumferential surface thereof at a distance therefrom so as to guide the wafer during displacement thereof onto the main surface of the mount plate when the wafer is released by the vacuum holder.

21. A method for applying a wafer to a mount plate as claimed in claim 11; wherein the first surface of the wafer is not in contact with the main surface of the mount plate prior to the evacuating step.

22. A method for applying a wafer to a mount plate as claimed in claim 11; wherein the applying step comprises applying a semiconductor wafer to the vacuum holder.

23. A method for applying a wafer to a mount plate, comprising the steps of:

providing a wafer having a first surface and a second surface;

providing a mount plate having a main surface;

disposing an adhesive layer on the first surface of the wafer or on the main surface of the mount plate;

applying the wafer at the second surface thereof to a vacuum holder to hold the wafer through suction;

placing a vacuum-tight sealing enclosure over the wafer and the main surface of the mount plate to define a sealed space while maintaining the first surface of the wafer at a given distance from the main surface of the mount plate; and evacuating the sealed space to effect release of the wafer from the vacuum holder and dropping of the wafer onto the main surface of the mount plate such that the wafer does not contact the mount plate prior to evacuating the sealed space.

24. A method for applying a wafer to a mount plate as claimed in claim 23; wherein the evacuating step comprises evacuating the sealed space to effect dropping of the wafer onto the main surface of the mount plate after the wafer is released by the vacuum holder.

25. A method for applying a wafer to a mount plate as claimed in claim 23; wherein the evacuating step comprises evacuating the sealed space at a degree of vacuum higher than the degree of vacuum of the vacuum holder.

26. A method for applying a wafer to a mount plate as claimed in claim 25; wherein the evacuating step comprises evacuating the sealed space at a degree of vacuum of from 90 mmHg to 160 mmHg higher than the degree of vacuum of the vacuum holder.

27. A method for applying a wafer to a mount plate as claimed in claim 23; wherein the placing step includes maintaining the first surface of the wafer at a distance of 0.2 mm to 3 mm from the main surface of the mount plate.

28. A method for applying a wafer to a mount plate as claimed in claim 23; wherein the applying step comprises adjusting the degree of vacuum of the vacuum holder from 600 mmHg to 650 mmHg.

29. A method for applying a wafer to a mount plate as claimed in claim 23; wherein the disposing step comprises disposing the adhesive layer on the first surface of the wafer.

30. A method for applying a wafer to a mount plate as claimed in claim 23; wherein the disposing step comprises disposing the adhesive layer on the main surface of the mount plate.

31. A method for applying a wafer to a mount plate as claimed in claim 23; wherein the applying step comprises applying a semiconductor wafer to the vacuum holder.

* * * * *